United States Patent [19]
Kim

[11] Patent Number: 6,166,986
[45] Date of Patent: Dec. 26, 2000

[54] SEMICONDUCTOR MEMORY DEVICE

[75] Inventor: Mi Young Kim, Kyoungki-do, Rep. of Korea

[73] Assignee: Hyundai Electronics Industries Co., Ltd., Kyoungki-do, Rep. of Korea

[21] Appl. No.: 09/337,010

[22] Filed: Jun. 28, 1999

[30] Foreign Application Priority Data

Jun. 29, 1998 [KR] Rep. of Korea ............... 98-24838

[51] Int. Cl.[7] .................................................. G11C 8/00
[52] U.S. Cl. ............................ 365/230.06; 365/230.03
[58] Field of Search .......................... 365/230.06, 230.03

[56] References Cited

U.S. PATENT DOCUMENTS

| | | | |
|---|---|---|---|
| 5,084,841 | 1/1992 | Williams et al. | 365/189.07 |
| 5,289,428 | 2/1994 | Sato et al. | 365/230.03 |
| 5,497,353 | 3/1996 | Sato et al. | 365/230.05 |
| 5,778,415 | 7/1998 | Marietta et al. | 711/5 |

*Primary Examiner*—Huan Hoang
*Attorney, Agent, or Firm*—Nath & Associates; Gary M. Nath; Harold L. Novick

[57] ABSTRACT

A semiconductor memory device decreases a layout area by reducing the number of input lines of input/output sense-amp (IOSA) enable logic. In a semiconductor memory device including m cell arrays on the basis of a word line, each of the m cell arrays being divided into n sub-cell blocks on the basis of a column line, the semiconductor memory device includes: a decoder which receives and decodes a plurality of column addresses coded by a gray code, and enables a local input/output sense-amp which is mounted to both sides of a corresponding sub-cell block among the n sub-cell blocks through the medium of a local input/output line, wherein the n sub-cell blocks are arranged in order of the gray code. As a result, the semiconductor memory device uses a small number of input lines as compared with the conventional input/output (IO) control enable logic, thereby decreasing a layout area as well as an area of an array control logic.

3 Claims, 8 Drawing Sheets

SEMICONDUCTOR MEMORY DEVICE

BACKGROUND OF THE INVENTION

1. Field of the Invention

The present invention relates to a semiconductor memory device. More particularly, it relates to a semiconductor memory device which simplifies an input/output control logic by controlling a decoding sequence of a sub-cell block mounted into a cell array.

2. Description of the Prior Art

One bank is divided into m cell arrays on the basis of a word line WL as shown in FIG. 1A showing a general core block, each cell array is divided into n sub-cell blocks on the basis of a column line Yi as shown in FIG. 1B showing an internal structure of a cell array of FIG. 1A.

A bit line sense-amp BLSA is positioned at the upper and lower parts of each sub-cell block. A sub-row decoder sub_xdec is positioned between the sub-cell blocks. A sub-hole block is positioned at the upper and lower parts of the sub-row decoder sub_xdec.

According to the above bank structure, a cell data is loaded on a bit line by an enabled word line WL, and is amplified by a bit line sense-amp BLSA.

After that, if a read command or a write command is input, a column address is received, the column address is then decoded, so that a corresponding column line Yi is enabled. The data connected to an enabled column line Yi is only passed and then loaded on an input/output (hereinafter referred to as IO) line. In this case, a structure of the input/output (IO) line is the same as FIG. 2.

FIG. 2 illustrates a structure of a general input/output (IO) line.

Referring to FIG. 2, the data loaded on a segment input/output (hereinafter referred to as SIO) line 10 positioned at the upper and lower parts of a cell array by a column line Yi is again loaded on a local input/output (hereinafter referred to as LIO) line 12 in both sub-hole blocks. The data is transmitted to an input/output sense-amp IOSA mounted into an input/output control circuit 14 in a bank control block. An output data of the input/output sense-amp IOSA is loaded on a global input/output (GIO) line 16. In a writing operation, a data of a global line is input to a write driver mounted into the input/output control circuit 14 in a bank control block, and is then loaded on the local input/output (LIO) line 12.

Here, the reference numeral 14 indicates a block including both the input/output sense-amp IOSA and the write driver WD. In the present invention, the input/output sense-amp IOSA and the write driver WD are called an input/output (IO) control circuit.

As stated above, since one cell array is divided into n sub-cell blocks, the number of the input/output sense-amps (IOSAs) is n+1. Since a plurality of global input/outputs (GIOs) being an output of each input/output sense-amp IOSA are at the same line, only two input/output sense-amps IOSAs on which data is loaded by a column line Yi should be enabled.

A decoding input address of selecting a sub-cell block having the enabled column line Yi is needed as an input of an input/output sense-amp (IOSA) enable logic. The input/output sense-amp (IOSA) enable logic is mounted into the input/output sense-amp IOSA & write driver block 14.

For example, as shown in FIG. 3 illustrating a general sub-cell block decoding, assuming that the number of sub-cell blocks is 8 on the basis of the column line Yi, the number of column addresses for a block selection is 3. These three column addresses are determined as A5, A6 and A7, respectively.

If a decoding sequence of the column addresses A5, A6 and A7 of a sub-cell block is determined as a sequence from 0 to 7 (i.e., 0->1->2->3->4->5->6->7), a combination of the column addresses A5, A6 and A7 for enabling each of nine input/output sense-amps (IOSAs) is as follows.

First, an input/output sense-amp IOSA<0> is enabled only under the condition that a decoding of the column addresses A5,A6 and A7 is "0" (i.e., A5("L"), A6("L") and A7("L")). Namely, as shown in FIG. 4A, a logic for enabling the input/output sense-amp IOSA<0> enables a corresponding input/output sense-amp IOSA<0> by using a NAND gate N1 performing a NAND operation about three inputs A5b, A6b and A7b. In addition, a structure of another input/output sense-amp IOSA<8> is identical with that of the input/output sense-amp IOSA<0>.

An input/output sense-amp IOSA<1> should be enabled under the condition that the column addresses A5, A6 and A7 are "0"(i.e., A5("L"), A6("L") and A7("L")) and "1"(i.e., A5("L"), A6("L") and A7("H")). Accordingly, as shown in FIG. 4B, the column addresses A5 and A6 of "L" are used as an input of an enable logic of the input/output sense-amp IOSA<1>, and the other column address A7 is disregarded. A NAND gate N2 performing a NAND operation about the column addresses A5 and A6 enables a corresponding input/output sense-amp IOSA<1>.

Other input/output sense-amps IOSA<1>, IOSA<3>, IOSA<5> and IOSA<7> also achieve a logic by using the column addresses A5 and A6 without using the column address A7.

The input/output sense-amp IOSA<2> should be enabled only under the condition that the column addresses A5, A6 and A7 are "1"(i.e., A5("L"), A6("L") and A7("H")) and "2"(i.e., A5 ("L"), A6("H") and A7("L")), so that the input/output sense-amp IOSA<2> is enabled under the condition that the column address AS is "L" and the other column addresses A6 and A7 are either "L,H" or "H,L".

Accordingly, as shown in FIG. 4C, an enable logic of the input/output sense-amp IOSA<2> enables a corresponding input/output sense-amp IOSA<2> by using a plurality of input lines and a plurality of NAND gates N3, N4, N5 and N6. Also, the number of input lines of an input/output sense-amp IOSA<6> is identical with the number of input lines of the input/output sense-amp IOSA<2>.

In case of an input/output sense-amp IOSA<4>, the input/output sense-amp IOSA<4> should be enabled under the condition that the column addresses A5, A6 and A7 are "L, H, H" and "H, L, L". Accordingly, as shown in FIG. 4D, the enable logic employs a plurality of input lines, a plurality of NAND gates N7, N8 and N9, and an inverter IV1.

As stated above, in case of decoding k addresses in order to enable only one sub-cell block among n sub-cell blocks, all of the k addresses should be needed as an input of the input/output (IO) control circuit, thereby requiring a complicated circuit and enlarging a layout area.

SUMMARY OF THE INVENTION

Accordingly, the present invention is directed to a semiconductor memory device that substantially obviates one or more of the problems due to limitations and disadvantages of the related art.

It is an objective of the present invention to provide a semiconductor memory device which decreases a layout area by reducing the number of input lines of input/output sense-amp (IOSA) enable logic.

To achieve the above objective, in a semiconductor memory device including m cell arrays on the basis of a word line, each of the m cell arrays being divided into n sub-cell blocks on the basis of a column line, the semiconductor memory device includes:

a decoder which receives and decodes a plurality of column addresses coded by a gray code, and enables a local input/output sense-amp which is mounted to both sides of a corresponding sub-cell block among the n sub-cell blocks through the medium of a local input/output line, wherein the n sub-cell blocks are arranged in order of the gray code.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 1A:
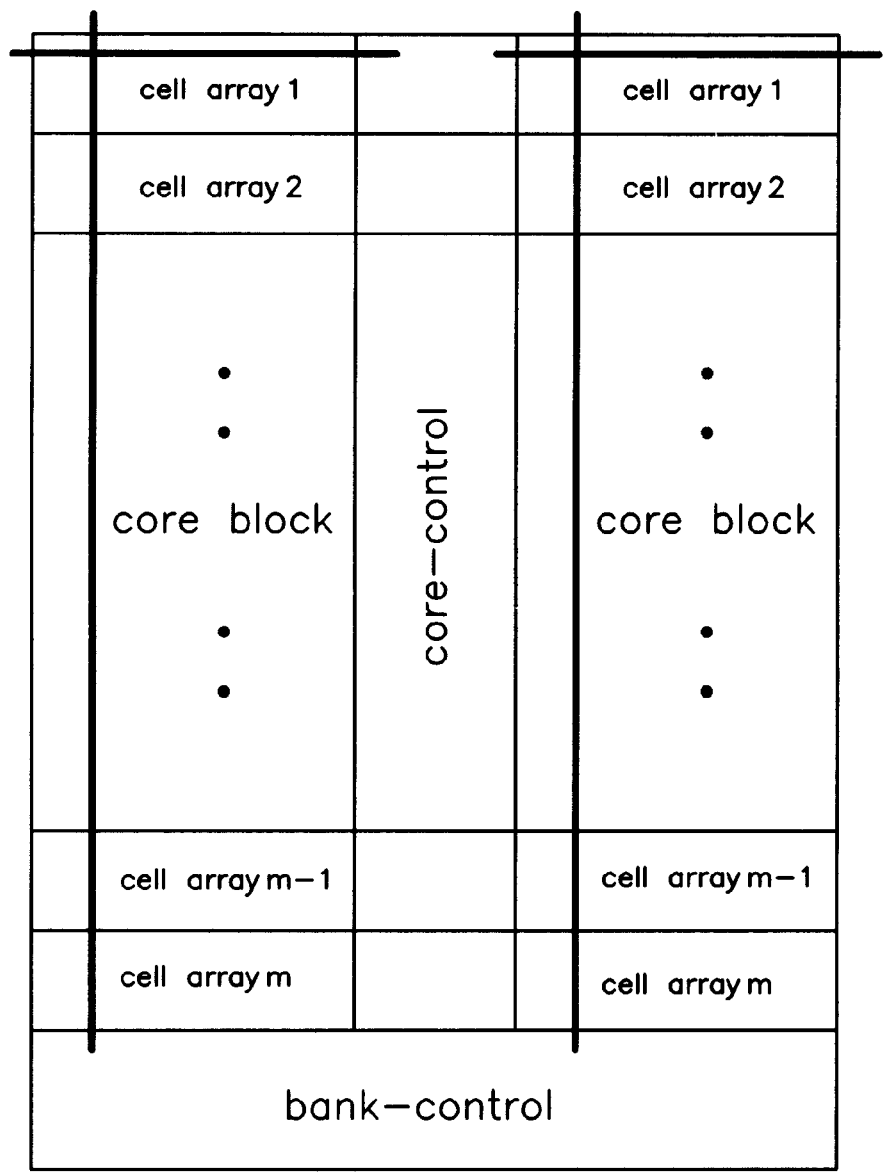
FIG. 1A illustrates a general core block.
Figure 1B:
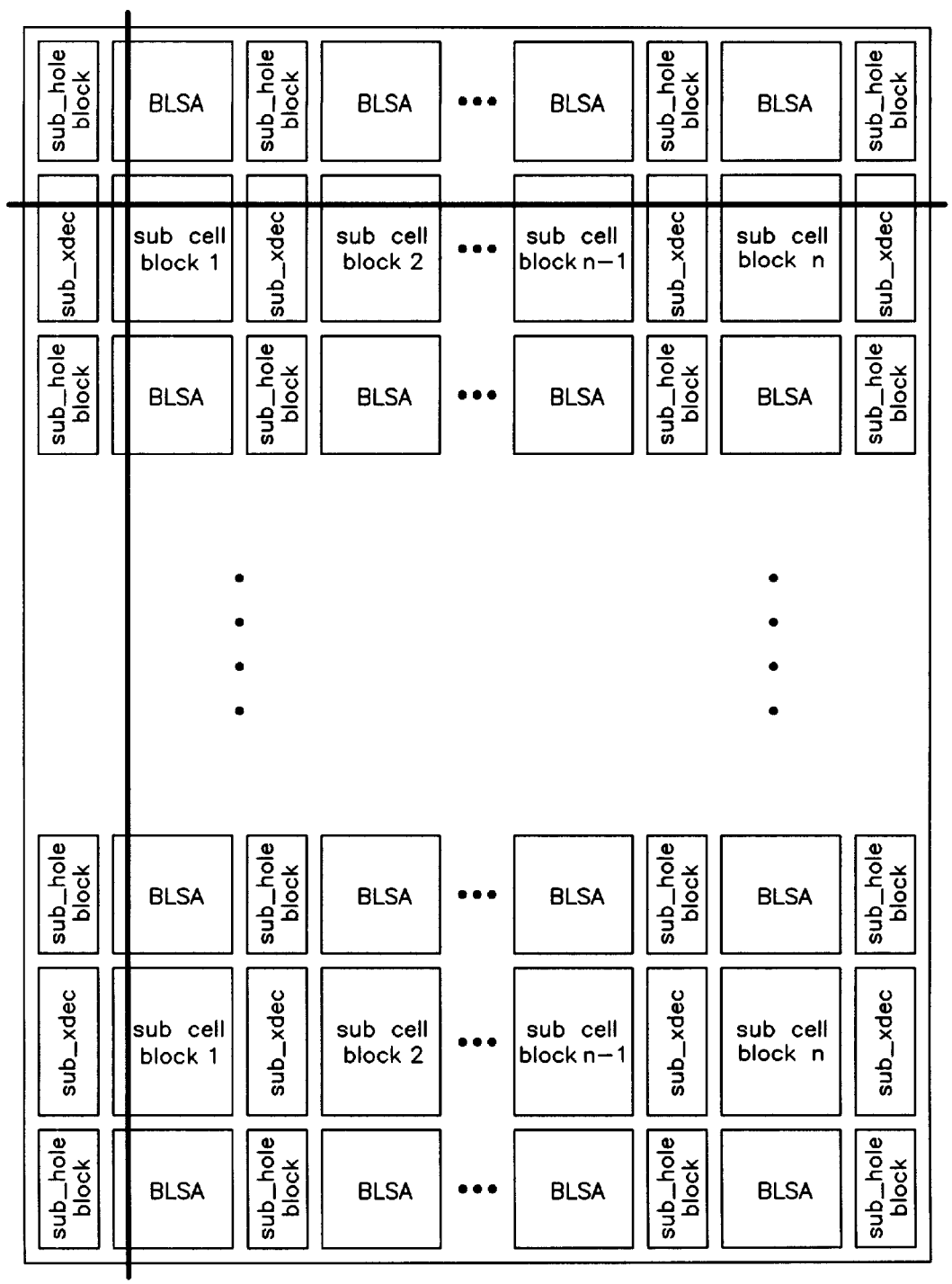
FIG. 1B illustrates an internal structure of a cell array shown in FIG. 1A.
Figure 2:
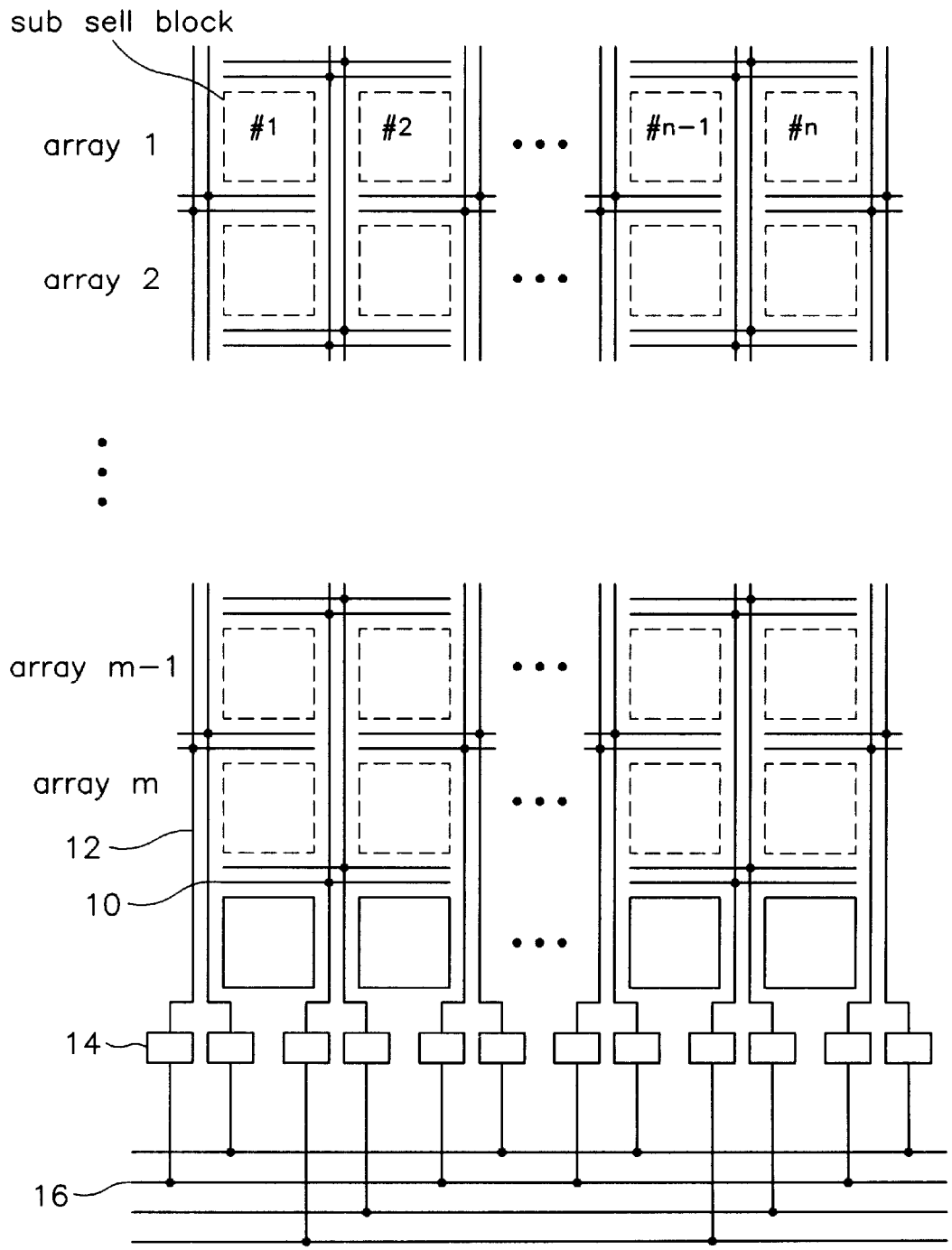
FIG. 2 illustrates a structure of a general input/output (IO) line.
Figure 3:
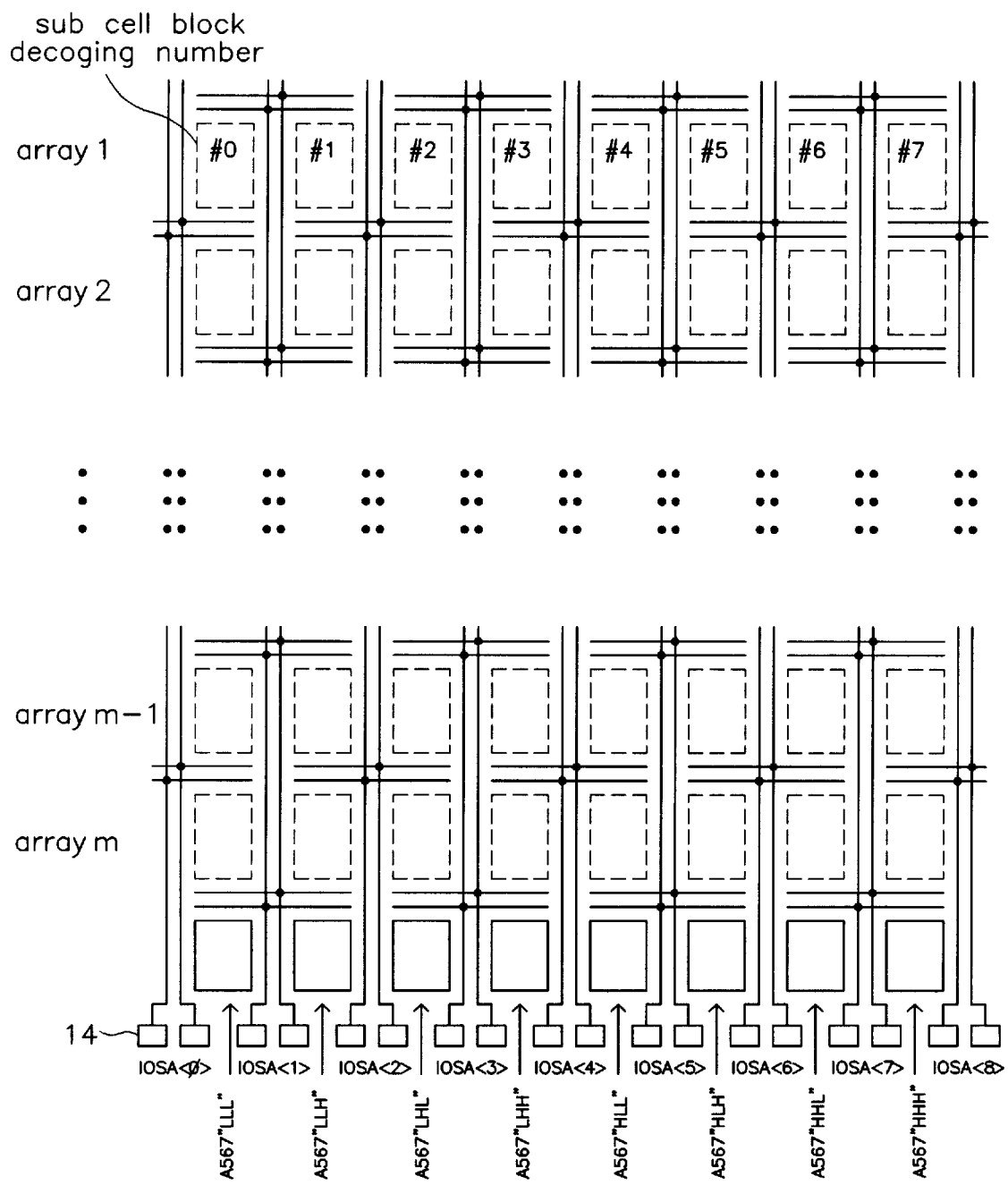
FIG. 3 illustrates a general sub-cell block decoding.
Figure 4A:
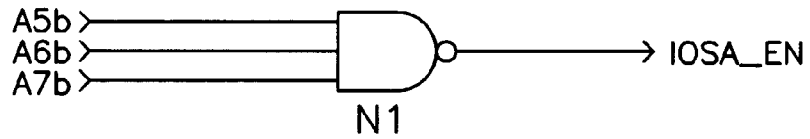
FIGS. 4A–4D illustrate a logic for enabling an input/output sense-amp IOSA shown in FIG. 3.
Figure 4B:
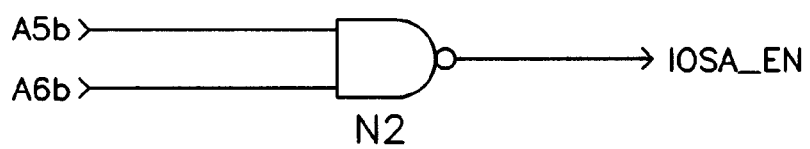
Figure 4C:
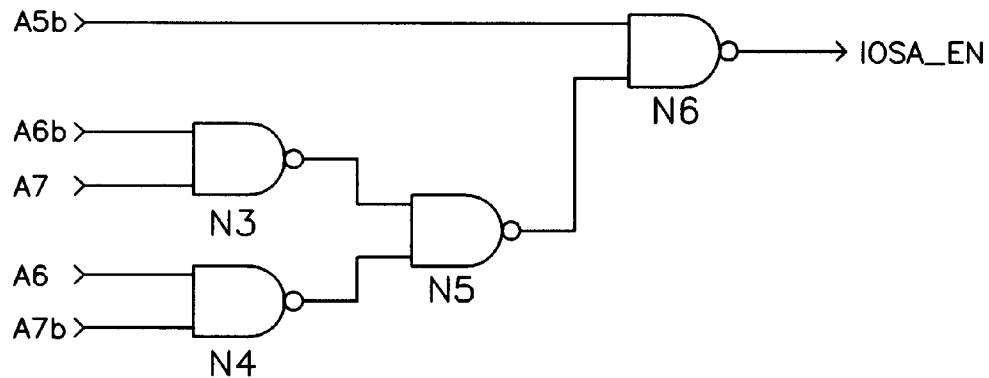
Figure 4D:
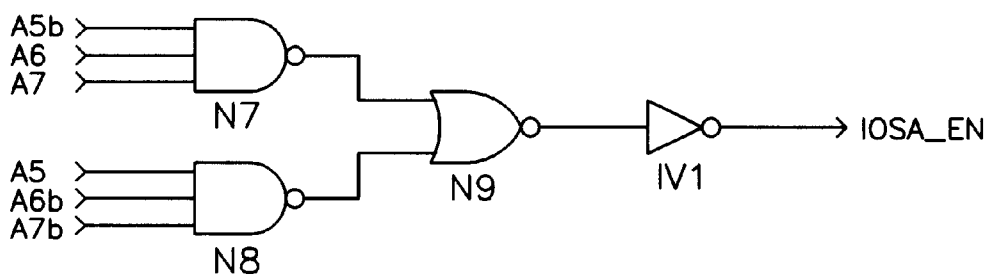
Figure 5:
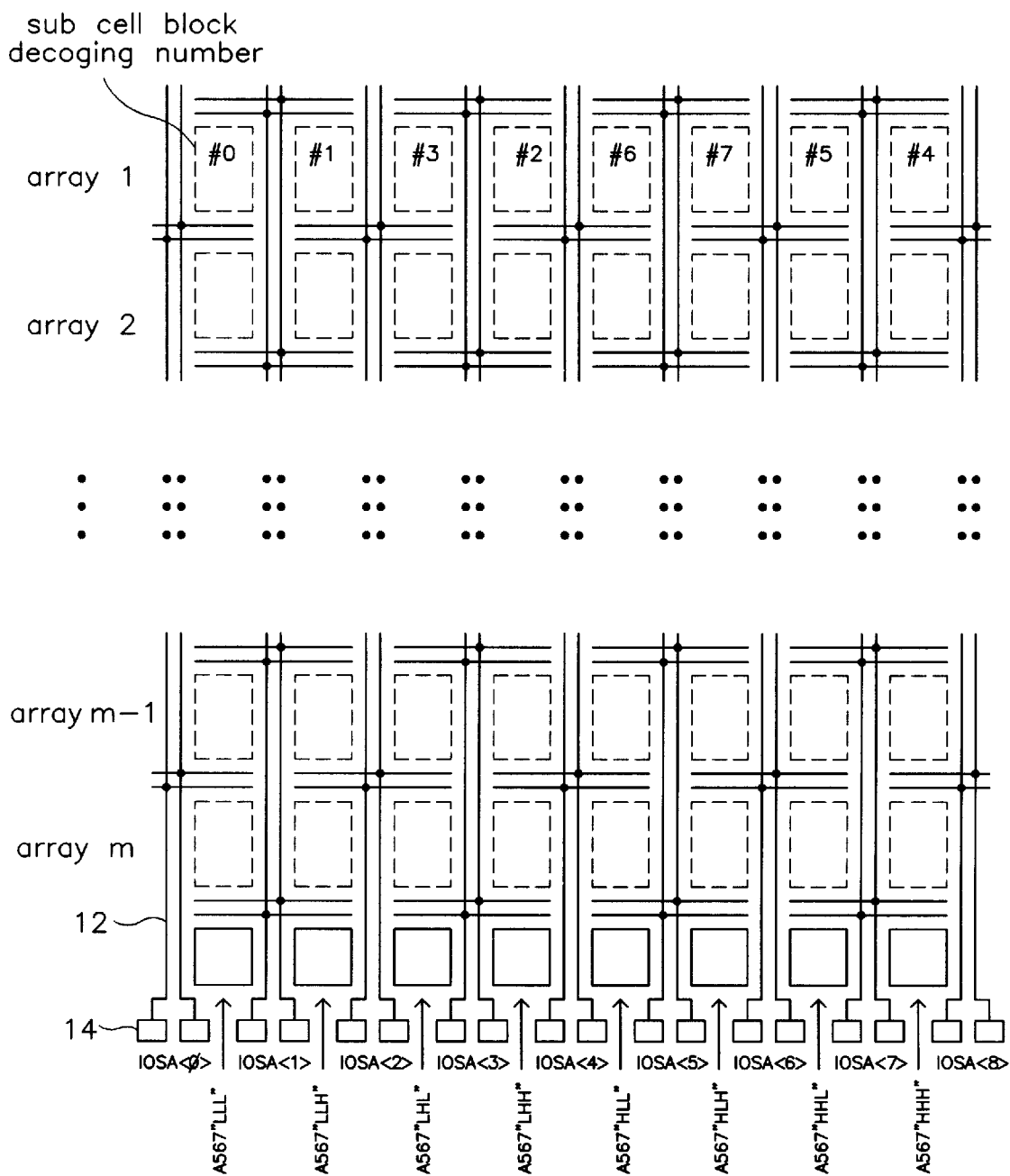
FIG. 5 illustrates a sub-cell block decoding of a semiconductor memory device according to the present invention.

FIG. 5 illustrates a sub-cell block decoding of a semiconductor memory device according to the present invention. In a preferred embodiment of the present invention, a decoding of column addresses A5, A6 and A7 of 8 sub-cell blocks #0–#7 is achieved by a gray code.

Namely, assuming that a decoding sequence of the column addresses A5, A6 and A7 of a sub-cell block is determined as a sequence of 0(i.e., A5("L"), A6("L") and A7("L"))->1(i.e., A5("L"), A6("L") and A7("H"))->3(i.e., A5("L"), A6("H") and A7("H"))->2(i.e., A5("L"), A6("H") and A7("L"))->6(i.e., A5("H"), A6("H") and A7("L"))->7 (i.e., A5("H"), A6("H") and A7("H"))->5(i.e., A5("H"), A6("L") and A7("H"))->4(i.e., A5("H"), A6("L") and A7("L")), the column addresses A5, A6 and A7 of two sub-cell blocks adjacent to each other have a difference of 1 bit.

For example, assuming that a sub-cell block wherein a column line Yi is enabled is a sub-cell block #0 wherein the column addresses A5, A6 and A7 are "L", data is transmitted to a local input/output line 12 of both sides of the sub-cell block #0 by the column line Yi. At this time, an input/output sense-amp IOSA<0> and another input/output sense-amp IOSA<1> are enabled.

In case of the sub-cell block #1, input/output sense-amps to be enabled become the input/output sense-amps IOSA<1> and IOSA<2>. In the remaining sub-cell blocks, input/output sense-amps to be enabled are also the input/output sense-amps IOSA<1> and IOSA<2>.

Figure 6A:
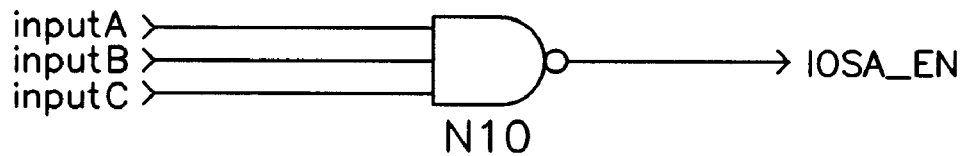
FIGS. 6A–6B illustrate a circuit diagram of a logic for enabling an input/output sense-amp IOSA shown in FIG. 5.
Figure 6B:
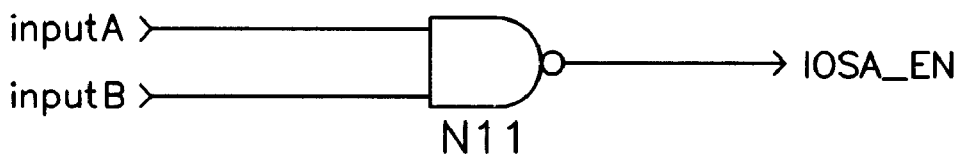

A logic for enabling each input/output sense-amp IOSA uses a logic shown in FIGS. 6A–6B.

FIGS. 6A–6B illustrate a circuit diagram of a logic for enabling an input/output sense-amp IOSA shown in FIG. 5.

In case that the input/output sense-amp IOSA<0> is to be enabled, the input/output sense-amp IOSA<0> should be enabled only under the condition that the sub-cell block #0 is selected. Accordingly, as shown in FIG. 6A, an enable logic of the input/output sense-amp IOSA<0> is comprised of a three-input NAND gate N10 receiving the column addresses A5, A6 and A7 of "L" as an input.

Such structure is equally applied to another input/output sense-amp IOSA<8>, an enable logic of the input/output sense-amp IOSA<8> is comprised of a three-input NAND gate N10 receiving a signal "H, L, L" of the column addresses A5, A6 and A7 as an input.

As shown in FIG. 6B, enable logics of the remaining input/output sense-amps IOSA<1>, IOSA<2>, IOSA<3>, IOSA<4>, IOSA<5>, IOSA<6> and IOSA<7> excepting two input/output sense-amps IOSA<0> and IOSA<8> positioned at the edge portion are comprised of two-input NAND gate N11.

That is, a condition for enabling the input/output sense-amp IOSA<1> is that the sub-cell blocks #0 and #1 are selected, so that the input/output sense-amp IOSA<1> should be enabled under that condition that the column addresses A5, A6 and A7 are "L, L, L" and "L, L, H". Accordingly, an enable logic of the input/output sense-amp IOSA<1> is comprised of two-input NAND gate N11 receiving a signal that the column addresses A5 and A6 are "L, L" as an input, as shown in FIG. 6B.

A condition for enabling the input/output sense-amp IOSA<2> is that the sub-cell blocks #1 and #3 are selected, so that the input signal of two-input NAND gate N11 being an enable logic of the input/output sense-amp IOSA<2> is a signal "L, H" of the column addresses A5 and A7 in the column addresses A5, A6 and A7 of the sub-cell blocks #1 and #3.

A condition for enabling the input/output sense-amp IOSA<3> is that the sub-cell blocks #3 and #2 are selected, so that the input signal of two-input NAND gate N11 being an enable logic of the input/output sense-amp IOSA<3> is a signal "L, H" of the column addresses A5 and A6 in the column addresses A5, A6 and A7 of the sub-cell blocks #3 and #2.

A condition for enabling the input/output sense-amp IOSA<4> is that the sub-cell blocks #2 and #6 are selected, so that the input signal of two-input NAND gate N11 being an enable logic of the input/output sense-amp IOSA<4> is a signal "H, L" of the column addresses A6 and A7 in the column addresses A5, A6 and A7 of the sub-cell blocks #2 and #6.

A condition for enabling the input/output sense-amp IOSA<5> is that the sub-cell blocks #6 and #7 are selected, so that the input signal of two-input NAND gate N11 being an enable logic of the input/output sense-amp IOSA<5> is a signal "H, H" of the column addresses A5 and A6 in the column addresses A5, A6 and A7 of the sub-cell blocks #6 and #7.

A condition for enabling the input/output sense-amp IOSA<6> is that the sub-cell blocks #7 and #5 are selected, so that the input signal of two-input NAND gate N11 being an enable logic of the input/output sense-amp IOSA<6> is a signal "H, H" of the column addresses A5 and A7 in the column addresses A5, A6 and A7 of the sub-cell blocks #7 and #5.

A condition for enabling the input/output sense-amp IOSA<7> is that the sub-cell blocks #5 and #4 are selected, so that the input signal of two-input NAND gate N11 being an enable logic of the input/output sense-amp IOSA<7> is a signal "H, L" of the column addresses A5 and A6 in the column addresses A5, A6 and A7 of the sub-cell blocks #5 and #4.

In the meantime, the preferred embodiment of the present invention is applied to an enable circuit of a write driver.

As described above, in the semiconductor memory device according to the present invention, the decoding addresses of adjacent two sub-cell blocks have a difference of only 1 bit therebetween, and the number of input lines of an enable logic of an input/output (IO) control circuit becomes 'k–1'. As a result, the present invention uses a small number of input lines as compared with the conventional input/output (IO) control enable logic, thereby reducing a layout area as well as a bank control area.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A semiconductor memory device including m cell arrays on the basis of a word line, each cell array being divided into n sub-cell blocks on the basis of a column line, the semiconductor memory device, comprising:

a decoder which receives and decodes a column address coded by a gray code, and enables a local input/output sense-amp which is mounted to both sides of a sub-cell block corresponding to the column address, wherein the n sub-cell blocks are arranged in order of the gray code.

2. A semiconductor memory device according to claim 1, wherein:

a decoder of decoding a column address selecting a sub-cell block positioned at edge portion, among the n sub-cell blocks, is comprised of a single three-input NAND gate.

3. A semiconductor memory device according to claim 1, wherein:

a decoder of decoding a column address selecting a sub-cell block positioned at other portions excepting edge portion, among the n sub-cell blocks, is comprised of a single two-input NAND gate.

* * * * *